(12) United States Patent
Oh

(10) Patent No.: US 11,488,973 B2
(45) Date of Patent: Nov. 1, 2022

(54) MEMORY DEVICE HAVING STAIRCASE STRUCTURE INCLUDING WORD LINE TIERS AND FORMATION METHOD THEREOF

(71) Applicant: Yangtze Memory Technologies Co., Ltd., Wuhan (CN)

(72) Inventor: Jin Yong Oh, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/901,786

(22) Filed: Jun. 15, 2020

(65) Prior Publication Data

US 2021/0366923 A1 Nov. 25, 2021

Related U.S. Application Data

(63) Continuation of application No. PCT/CN2020/091812, filed on May 22, 2020.

(51) Int. Cl.
*H01L 27/11575* (2017.01)
*H01L 27/11573* (2017.01)
*H01L 27/11582* (2017.01)

(52) U.S. Cl.
CPC .. *H01L 27/11575* (2013.01); *H01L 27/11573* (2013.01); *H01L 27/11582* (2013.01)

(58) Field of Classification Search
CPC ......... H01L 27/11524; H01L 27/11529; H01L 27/11573; H01L 27/11575; H01L 27/11582; H01L 27/11526; H01L 27/1157; H01L 27/11531; H01L 27/11534

USPC .......................................................... 257/314
See application file for complete search history.

(56) References Cited

U.S. PATENT DOCUMENTS

| | | | | |
|---|---|---|---|---|
| 10,115,681 | B1* | 10/2018 | Ariyoshi | H01L 27/11524 |
| 10,290,645 | B2* | 5/2019 | Nakatsuji | H01L 23/5226 |
| 11,114,379 | B2* | 9/2021 | Gossman | H01L 21/76816 |
| 2017/0179026 | A1* | 6/2017 | Toyama | H01L 27/11573 |
| 2019/0081069 | A1* | 3/2019 | Lu | H01L 27/11573 |
| 2019/0088676 | A1* | 3/2019 | Tagami | H01L 25/0657 |
| 2020/0058669 | A1* | 2/2020 | Chen | H01L 27/11582 |
| 2020/0082886 | A1* | 3/2020 | Huo | G11C 16/0483 |

(Continued)

FOREIGN PATENT DOCUMENTS

| | | |
|---|---|---|
| CN | 107658317 B | 1/2019 |
| CN | 107731828 B | 1/2019 |

(Continued)

*Primary Examiner* — Khiem D Nguyen
(74) *Attorney, Agent, or Firm* — Anova Law Group, PLLC

(57) ABSTRACT

Memory device and formation method are provided. The memory device includes a substrate; a staircase structure on the substrate; a string driver structure over the staircase structure on a side opposite to the substrate; and a metal routing structure, between the string driver structure and the staircase structure along a vertical direction with respect to a lateral surface of the substrate. The staircase structure includes a plurality of word line tiers. The string driver structure includes a plurality of transistors to individually address the plurality of word line tiers. The string driver structure and the metal routing structure are vertically aligned with the staircase structure based on a lateral central region of the staircase structure.

20 Claims, 5 Drawing Sheets

(56) References Cited

U.S. PATENT DOCUMENTS

2020/0091164 A1* 3/2020 Liu .................. H01L 27/11548
2020/0194452 A1* 6/2020 Xiao .................. H01L 27/1157

FOREIGN PATENT DOCUMENTS

| CN | 107658315 B | | 5/2019 | |
|---|---|---|---|---|
| CN | 110998846 A | | 4/2020 | |
| KR | 10-2012-0075882 A | * | 7/2012 | ............. G11C 16/00 |
| KR | 20120075882 A | | 7/2012 | |
| TW | 200418147 A | | 9/2004 | |
| TW | 200503254 A | | 1/2005 | |
| TW | 202011579 A | | 3/2020 | |

* cited by examiner

MEMORY DEVICE HAVING STAIRCASE STRUCTURE INCLUDING WORD LINE TIERS AND FORMATION METHOD THEREOF

CROSS-REFERENCE TO RELATED APPLICATION

This application is a continuation of International Application No. PCT/CN2020/091812, filed on May 22, 2020, the entire content of which is incorporated herein by reference.

FIELD OF THE DISCLOSURE

The present disclosure generally relates to the field of memory device and, more particularly, relates to memory device and formation method thereof.

BACKGROUND

A non-volatile memory device may be a three-dimensional (3D) memory device in a form of NAND, NOR, cross-point, or the like. The non-volatile memory device may include a large number of non-volatile memory cells arranged in rows and columns. The memory cells are stacked over one another. Each group of memory cells may share a plurality of access lines, such as word lines and bit lines.

In a NAND memory device, connection between string driver transistors (or word line drivers) and respective word lines is an important architecture decision, which affects the NAND die area, die performance and system metrics. The string driver transistors need to support high voltages and break down condition and occupy a significant area of the NAND die. The arrangement of the string driver transistors affects the contact area availability and block height dimensions in a memory device.

Further, as the number of word line tiers increases, the total string driver area increases, which not only impacts the die size for the memory devices but also impacts deposition of other peripheral devices such as page buffers.

The disclosed devices and methods are directed to solve one or more problems set forth above and other problems in the art.

BRIEF SUMMARY OF THE DISCLOSURE

One aspect of the present disclosure provides a memory device. The memory device includes a substrate; a staircase structure on the substrate; a string driver structure over the staircase structure on a side opposite to the substrate; and a metal routing structure, between the string driver structure and the staircase structure along a vertical direction with respect to a lateral surface of the substrate. The staircase structure includes a plurality of word line tiers. The string driver structure includes a plurality of transistors to individually address the plurality of word line tiers. The string driver structure and the metal routing structure are vertically aligned with the staircase structure based on a lateral central region of the staircase structure.

Another aspect of the present disclosure provides a method for forming a memory device. An alternating conductor/dielectric stack is formed over a substrate and includes a plurality of word line tiers of a staircase structure over the substrate. A semiconductor device is formed including, a string driver structure and a metal routing structure contacting on the string driver structure, the string driver structure including a plurality of transistors. The metal routing structure of the semiconductor device is aligned and bonded with the staircase structure over the substrate, such that the string driver structure and the metal routing structure are vertically aligned with the staircase structure based on a lateral central region of the staircase structure, and the plurality of transistors of the string driver structure individually addresses the plurality of word line tiers of the staircase structure.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The present disclosure provides a memory device and a method of forming the memory device. The memory device includes a substrate; a staircase structure on the substrate; a string driver structure over the staircase structure on a side opposite to the substrate; and a metal routing structure, between the string driver structure and the staircase structure along a vertical direction with respect to a lateral surface of the substrate. The staircase structure includes a plurality of word line tiers. The string driver structure includes a plurality of transistors to individually address the plurality of word line tiers. The string driver structure and the metal routing structure are vertically aligned with the staircase structure based on a lateral central region of the staircase structure. In some embodiments, the lateral central region includes a lateral central line to divide the structure in half along a lateral direction.

Because the string driver structure, the staircase structure, and the metal routing structure are vertically aligned and stacked one over another, based on a lateral central region/line of the staircase structure, die/device space is saved and reduced, the string driver area is scaled, and overall die/device efficiency is improved.

As used herein, the term "memory device" refers to a semiconductor device at least having vertically oriented strings of memory cell transistors (referred to herein as "memory cell strings," such as NAND strings) on a laterally oriented substrate so that the memory strings extend in the vertical direction with respect to the substrate.

As used herein, the term "vertical/vertically" means substantially nominally perpendicular to the lateral surface of a substrate. Accordingly, a lateral direction of the substrate is along the lateral surface of the substrate, and a vertical direction is substantially perpendicular to the lateral direction of the substrate.

As disclosed herein, different structures/layers may be vertically aligned and stacked based on lateral central regions/lines, e.g., having lateral central regions and/or lateral central lines of these vertically aligned structures (or layers) substantially overlapped with one another.

Figure 1:
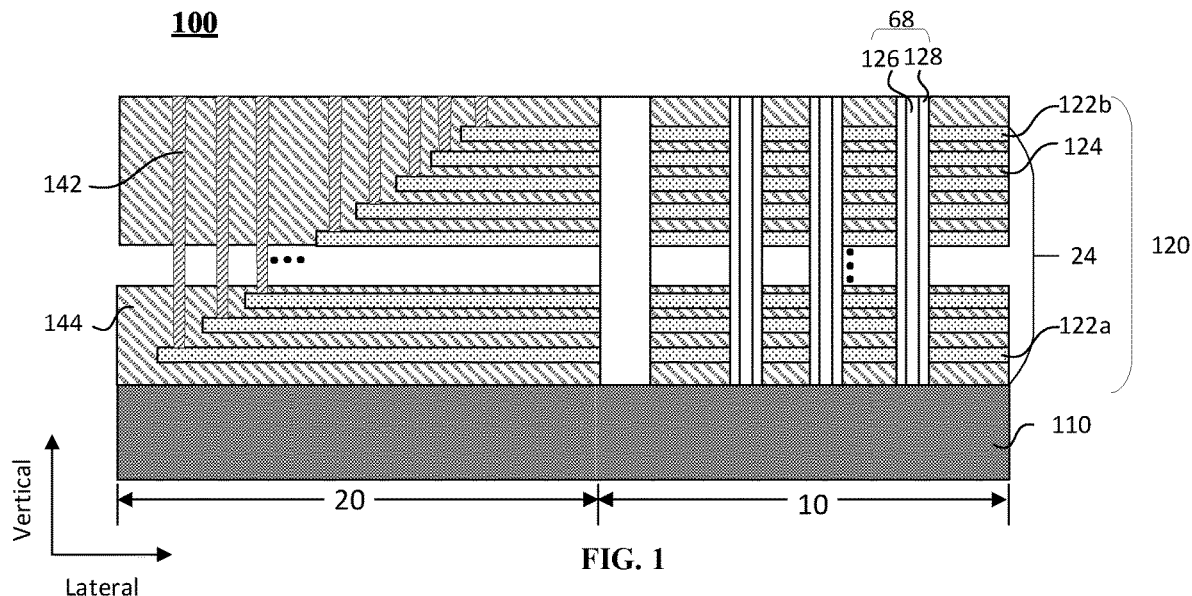
FIG. 1 illustrates a portion of an exemplary memory device consistent with various disclosed embodiments in the present disclosure.

FIG. 1 illustrates a cross-section of an exemplary memory device 100 according to various embodiments of the present disclosure.

The memory device 100 may include a substrate 110, and a plurality of conductor/dielectric layer pairs 24 formed over the substrate 110 to form an array device 120 over the substrate 110. The array device 120 may include a cell array structure formed in a cell array region 10 and a staircase structure formed in a staircase structure (SS) region 20.

The substrate 110 may include silicon (e.g., single crystalline silicon), silicon germanium (SiGe), gallium arsenide (GaAs), germanium (Ge), silicon on insulator (SOI), or any other suitable materials.

In one embodiment, the substrate 110 is silicon substrate. The substrate 110 may be undoped, partially doped or fully doped by p-type or n-type dopants. The doping of the substrate may be in the thickness direction and/or the width direction. The silicon substrate may be a thinned silicon substrate, e.g., a thinned single crystalline silicon layer. In some embodiments, the single crystalline silicon layer has a thickness between 200 nm to 50 μm. In some embodiments, the single crystalline silicon layer has a thickness between 500 nm to 5 μm. The single crystalline silicon layer may be partially or fully doped with n-type and/or p-type dopants.

As shown in FIG. 1, a "lateral" direction of the substrate 110 is along the lateral surface of the substrate 110, and a "vertical" direction is substantially perpendicular to the lateral direction of the substrate 110.

The conductor/dielectric layer pairs 24 formed over the substrate 110, may also be referred to as a "alternating conductor/dielectric stack." Each conductor/dielectric layer pair 24 may include a conductor layer 122 and a dielectric layer 124, extending to the cell array region 10 and the staircase structure (SS) region 20.

The conductor layer 122 extended in the staircase structure region 20 may act as word lines. The staircase structure in the staircase structure region 20 thus includes a plurality of word line tiers 122 having different stair lengths along the lateral direction of the substrate 110. For example, as shown in FIG. 1, conductor layer 122a closest to the substrate 110 may have a greatest stair length among all of the plurality of conductor layers 122 in the staircase structure region 20.

The conductor layers 122 and the dielectric layers 124 in the alternating conductor/dielectric stack 24 may alternate in the vertical direction with respect to the substrate 110. For example, except the ones at the top or bottom of alternating conductor/dielectric stack 24, each conductor layer 122 may be adjoined by two dielectric layers 124 on both sides, and each dielectric layer 124 may be adjoined by two conductor layers 122 on both sides. The conductor layers 122 may have the same thickness or may have different thicknesses. The dielectric layers 124 may have the same thickness or may have different thicknesses. In some embodiments, alternating conductor/dielectric stack 24 may include more conductor layers or more dielectric layers with different materials and/or thicknesses than the conductor/dielectric layer pair.

The conductor layer 122 may include conductive materials, such as tungsten (W), cobalt (Co), copper (Cu), aluminum (Al), doped silicon, silicides, and/or any other suitable conductor materials. The dielectric layer 124 may include dielectric materials, such as silicon oxide, silicon nitride, silicon oxynitride, and/or any other suitable dielectric materials.

In some embodiments, the memory device 100 may be a NAND Flash memory device. The array device 120 in the cell array region 10 over the substrate 110 may include cell array structure including memory cells. The memory cells may include a plurality of memory cell strings 68 that extends through conductor/dielectric layer pairs 24 over the substrate 110.

The memory cell strings 68 may include a plurality of control gates for the memory cells. The conductor layer 122 in the alternating conductor/dielectric stack 24 in the cell array region 10 may act as a control gate for each memory cell of memory cell string 68.

In one embodiment, the memory cell string 68 may include a semiconductor channel 126 and a composite layer 128. The semiconductor channel 126 may include silicon, such as amorphous silicon, polysilicon, or single crystalline silicon. The composite layer 128 may include, for example, a tunneling layer, a storage layer (or "charge trap/storage layer"), and a blocking layer. Each memory cell string 68 may have a cylinder shape. The semiconductor channel 126, the tunneling layer, the storage layer, and the blocking layer may be arranged along a direction from the central toward the outer surface of the cylinder in such order. In one embodiment, the composite layer 128 may include ONO dielectrics having, e.g., a tunneling layer including silicon oxide, a storage layer including silicon nitride, and a blocking layer including silicon oxide. In other embodiments, the memory cell string 68 may include any suitable configurations. For example, the memory cell string may include a channel layer formed between a dielectric filler and an ONO gate dielectric.

The memory cell strings 68 may include a select gate (e.g., a source select gate) at an end of memory cell string 68 that is closer to the substrate 110; and another select gate (e.g., a drain select gate) at an end of the memory cell string 68 further away from substrate 110.

The select gate may control the on/off state and/or a conductance of the semiconductor channel 126 of the memory cell string 68. In some embodiments, select gates include conductor materials including, but not limited to, W, Co, Cu, Al, doped silicon, silicides, or any combination thereof. For each memory cell string 68, an epitaxial plug (not illustrated) may be formed at the end of each memory cell string may contact both semiconductor channel and a doped region of substrate 110 to function as the channel controlled by a select gate at the end of memory cell string closer to the substrate 110.

The select gate of the memory cell string 68 may include one or more lower conductor layers of the alternating conductor/dielectric stack, such as the conductor layer 122a closer to the substrate 110 as shown in FIG. 1. Alternatively, the select gate of the memory cell string 68 may be a separate conductor layer formed between the substrate and the alternating conductor/dielectric stack. In some embodiments, the memory cell string further includes another select gate formed by one or more upper conductor layers of the alternating conductor/dielectric stack further away from the substrate 110. The select gate of the memory cell string may also be formed by a separate conductor layer above the alternating conductor/dielectric stack away from the substrate 110.

In some embodiments, the array device 120 over the substrate 110 may further include word line contact plugs 142 formed in the staircase structure region 20. The word line contact plugs 142 may extend vertically within a dielectric layer 144 over the substrate 110 in the staircase structure region 20. Each word line contact plug 142 may have an end (e.g., a lower end) in contact with a corresponding word line tier, e.g., a corresponding conductor layer 122 in the staircase structure region 20, to individually address the corresponding word line of the array device.

In some embodiments, each word line contact plug 142 contacts a corresponding word line tier 122 (a part of a conductor layer 122) on a side away from the substrate 110 along a vertical direction. The word line contact plugs 142 may include a conductive material formed by filling contact holes and/or contact trenches. In one embodiment, the conductive material may be W. In some embodiments, filling the contact holes and/or contact trenches may include depositing a barrier layer, an adhesion layer, and/or a seed layer before depositing the conductive material.

In various embodiments, the memory device may include one or more peripheral devices connected for controlling the array device over the substrate 110. In some embodiments, the one or more peripheral devices may include complementary metal-oxide-semiconductor (MOS) devices. The CMOS devices of the peripheral devices may be used as different functional devices for the memory device. For example, the peripheral devices may include drivers such as string drivers, page buffers, sense amplifiers, column decoders, and row decoders, a charge pump, a current or voltage reference, and/or any active or passive components of the circuits (e.g., transistors, diodes, resistors, or capacitors).

In some embodiments, a metal routing structure may be formed for routing signals between the peripheral devices and the array device. For example, the metal routing structure may transfer electrical signals between the peripheral device and the array device, or between different peripheral transistors.

In one embodiment, the memory device may include string driver transistors. Each string driver transistor is electrically connected to a surface of an end (opposite to the sub state) of a corresponding word line contact plug to thus individually address a corresponding word line of the memory cell strings.

Figure 2:
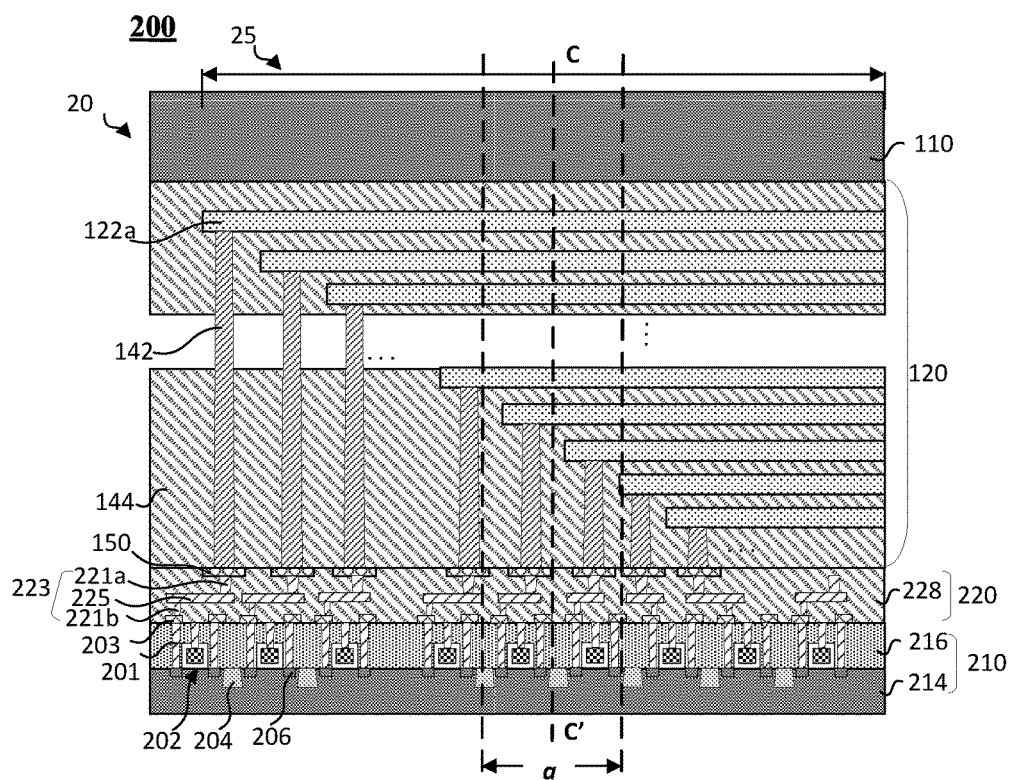
FIG. 2 illustrates a portion of another exemplary memory device according to various embodiments of the present disclosure.

For example, FIG. 2 illustrates an exemplary memory device 200 according to various embodiments of the present disclosure. The memory device 200 may include the structure of the memory device 100 shown in FIG. 1 and/or any other suitable structures for the memory device 200.

As shown in FIG. 2, staircase structure region 20 of the memory device 200 includes a staircase structure 25. The staircase structure 25 includes a plurality of word line tiers having different stair lengths in the staircase structure region 20. For example, the word line tier 122a, as a part of corresponding conductor layer 122a, may have the greatest stair length among all word line tiers of the staircase structure 25 in the staircase structure region 20. In some embodiments, the conductor layer having the greatest stair length may be a separate conductor layer configured between the substrate and the alternating conductor/dielectric stack.

The memory device 200 may further include a string driver structure 210 and a metal routing structure 220. The metal routing structure 220 may be formed between the string driver structure 210 and the staircase structure 25 in the staircase structure region 20.

The string driver structure 210 may be formed on a side of the array device 120 further away from the substrate 110 to allow more direct connection between the string driver structure 210 and the staircase structure 25, as shown in FIG. 2.

The string driver structure 210 may include a semiconductor layer 214 and a plurality of transistors 202 formed in/on the semiconductor layer 214.

The semiconductor layer 214 may be, e.g., a thinned substrate. In one embodiment, the entirety of the transistors 202 may be formed in the semiconductor layer 214. In some embodiments, the semiconductor layer 214 includes a single crystalline silicon. In some embodiments, the semiconductor layer 214 may be made of a material including SiGe, GaAs, Ge, and/or any other suitable materials. An isolation region 204 and a doped region 206, e.g., a source region or a drain region of transistor 202, may be formed in the semiconductor layer 214.

The string driver structure 210 may further include an interlayer dielectric (ILD) layer, such as a dielectric layer 216 formed on the semiconductor layer 214 and between adjacent transistors 202. The dielectric layer 216 may be made of a material including, but not limited to, silicon oxide, silicon nitride, silicon oxynitride, doped silicon oxide, or any combination thereof.

The metal routing structure 220 may include a plurality of metal layer structures 223 formed in a dielectric layer 228. Each metal layer structure 223 may include multiple metal layers made of a material including tungsten (W), copper (Cu), aluminum (Al), and/or any other suitable materials. The dielectric layer 228 may be made of a material including, but not limited to, silicon oxide, silicon nitride, silicon oxynitride, doped silicon oxide, or any combination thereof.

The metal routing structure 220 including metal layer structures 223 may be arranged vertically between the staircase structure 25 and the string driver structure 210. One metal layer structure 223 may connect one transistor 202 (of the plurality of transistors 202) with one word line tier 122 (of the plurality of word line tiers) to individually address a corresponding word line of the memory cell.

Each metal layer structure 223 may include a plurality of metal layers extending in the lateral and/or vertical directions in a second dielectric layer 228. For example, the metal layers may include vertically oriented metal layers such as contact plugs 221a-b extending along a vertical direction, and laterally oriented metal layers such as contact line(s) 225 extending along a lateral direction with respect to the substrate 110. The plurality of metal layers in each metal layer structure may include various types of layouts, configured for desirable metal/signal routing for improving overall die/device efficiency and for reducing or saving die/device space.

For example, a first contact plug 221a may be formed extending in the vertical direction to contact a contact pad 150 which is in contact with a corresponding word line contact plug 142. A second contact plug 221b may be formed extending in the vertical direction to contact a contact pad 203 which is in contact with a corresponding transistor 202. The contact line 225 may be formed as lateral contact lines connecting to each of the contact plugs 221a-b to provide desirable routing. For example, the contact line 225 in a different metal layer structure 223 may be different in order to accommodate the routing requirements.

As disclosed herein, the contact plugs/lines, the contact pads, and/or any metal layers may be made of same or different materials and may be formed by any suitable process both in vertical and lateral direction. The conductive materials may include, for example, W, Co, Cu, Al, silicides, or any combination thereof.

As such, each metal layer structure 223 may be electrically connected to one transistor 202 to transfer electrical signals to and from the corresponding transistor 202. Each metal layer structure 223 may further be electrically connected to a word line tier of the staircase structure 25 of the array device 120 such that the word line of the array device may be individually addressed.

For illustration purposes, the number of the word line tiers 122 of the staircase structure 25, the number of the metal layer structures 223 of the metal routing structure 220, and the number of the transistors 202 of the string driver structure 210 illustrated in FIG. 2 are exemplary, any numbers of the word line tiers, the metal layer structures, and the transistors may be included in the disclosed memory device. For example, additional metal layers may be added to accommodate increased number of word line tiers and transistors to provide memory device with small die size, high device density, and improved performance.

In various embodiments, to save the die/device space of the disclosed memory device, the transistors 202, e.g., string driver transistors, of the string driver structure 210 formed in a CMOS substrate may be deployed and aligned with the staircase structure 25 of the array device 120 in a vertical direction based on the central region/line of the staircase structure 25 in a lateral direction. The metal routing structure 220 may be arranged, between the staircase structure 25 and the string driver structure 210 in a vertical direction and aligned with the staircase structure 25 and/or the string driver structure 210 based on the central region/line of the staircase structure 25 in the lateral direction.

In various embodiments, when the staircase structure 25, the string driver structure 210, and the metal routing structure 220 are vertically aligned, a lateral central line and/or a lateral central region of one of the structures 25, 210, 220 may be overlapped with a lateral central line and/or a lateral central region of one or more of others of the structures 25, 210, 220.

As used herein, the term "lateral central region" refers to a central region of a structure/layer along a lateral direction with respect to the substrate. The term "lateral central line" refers to a central line of a structure/layer along a lateral direction with respect to the substrate. Portions of the structure/layer on both sides of the lateral central region/line may have substantially same lateral length. The lateral central line falls within the lateral central region. The lateral central region may be determined based on the lateral central line.

In some embodiments, the lateral central region (e.g., region a in FIG. 2) of a structure/layer (e.g., the staircase structure 25, the string driver structure 210, and/or the metal routing structure 220) may have a lateral length that is about 50% or less (e.g., about 40%, 30%, 20%, 10%, 5%, or less than 1%) of a total lateral length of the structure/layer.

In various embodiments, the number of transistors 202 on each side of the lateral central region/line of the string driver structure 210 along the lateral direction may be the same or different. The number of metal layer structures 223 on each side of the lateral central region/line of the metal routing structure 220 along the lateral direction may be the same or different. The number of word line contact plugs 142 on each side of the lateral central region/line of the staircase structure 25 along the lateral direction may be the same or different. In embodiments, the staircase structure 25, the string driver structure 210, and the metal routing structure 220 may have a same length or different lengths in the lateral direction.

In certain embodiments, the string driver structure 210 and/or the metal routing structure 220 may be vertically aligned with the staircase structure 25 to substantially symmetrically configured along a lateral central line C-C' of the staircase structure 25, as indicated in FIG. 2. In a specific embodiment, the string driver structure is only aligned and stacked with the staircase structure in the staircase structure region 20, and is not formed under/above the cell array structure in a cell array region 10, e.g., as shown in FIG. 1.

Figure 3:
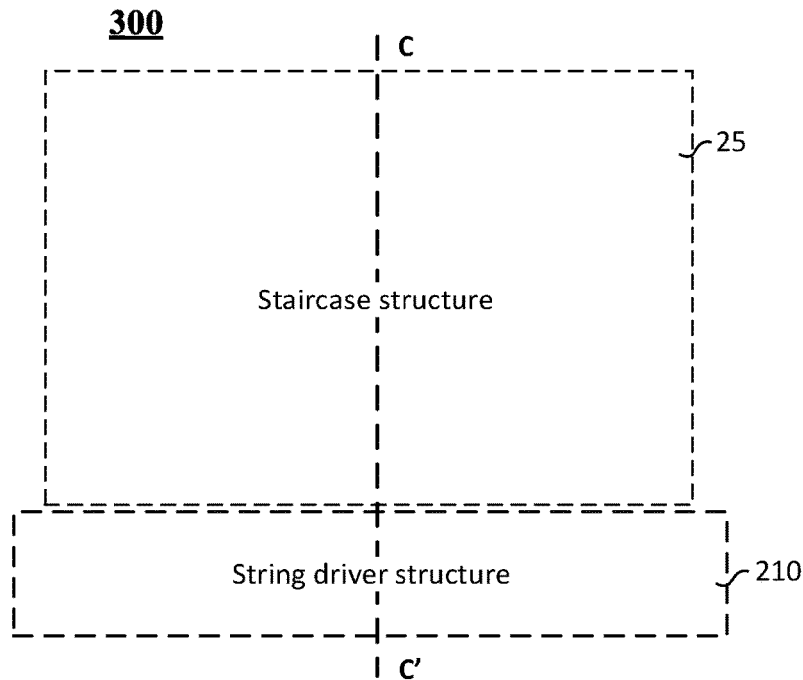
FIG. 3 illustrates an exemplary routing layout of a memory device consistent with various disclosed embodiments in the present disclosure.
Figure 4:
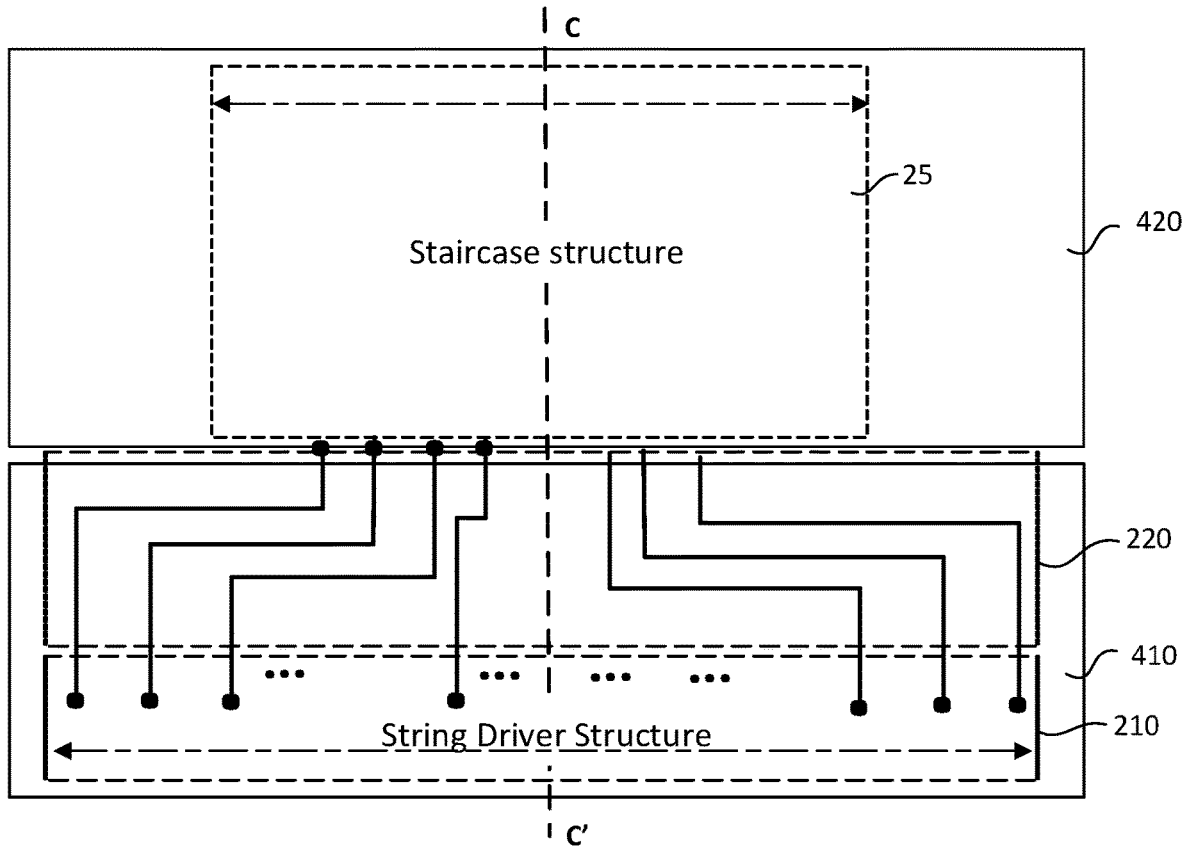
FIG. 4 illustrates another exemplary routing layout of a memory device consistent with various disclosed embodiments in the present disclosure.

For example, as shown in FIGS. 3-4, the transistors 202 of the string driver structure 210 formed in a CMOS substrate 410 may be formed on both sides of a lateral central line C-C' of the staircase structure 25. In one embodiment, the string driver structure 210 in the CMOS substrate 410, the metal routing structure 220 in the CMOS substrate 410, and the staircase structure 25 in an array substrate 420 may be formed to be laterally centered along the central line C-C' or along a lateral central region covering the central line C-C'.

In one embodiment, the lateral central line C-C' of the staircase structure 25 may be determined based on a word line tier having a greatest stair length in the staircase structure 25, e.g., among all of the conductor layers 122 of the array device 120. Of course, the lateral central line C-C' of the staircase structure 25 may fall within the lateral central region of the staircase structure 25. In some cases, the lateral central region of the staircase structure is determined based on the lateral central line of the staircase structure according to the greatest stair length in the staircase structure.

In this manner, because the string driver structure, the staircase structure, and the metal routing structure are vertically aligned and stacked one over another, based on a lateral central region/line of the staircase structure, die/device space is saved and reduced, the string driver area is scaled, and overall die/device efficiency is improved.

Figure 5:
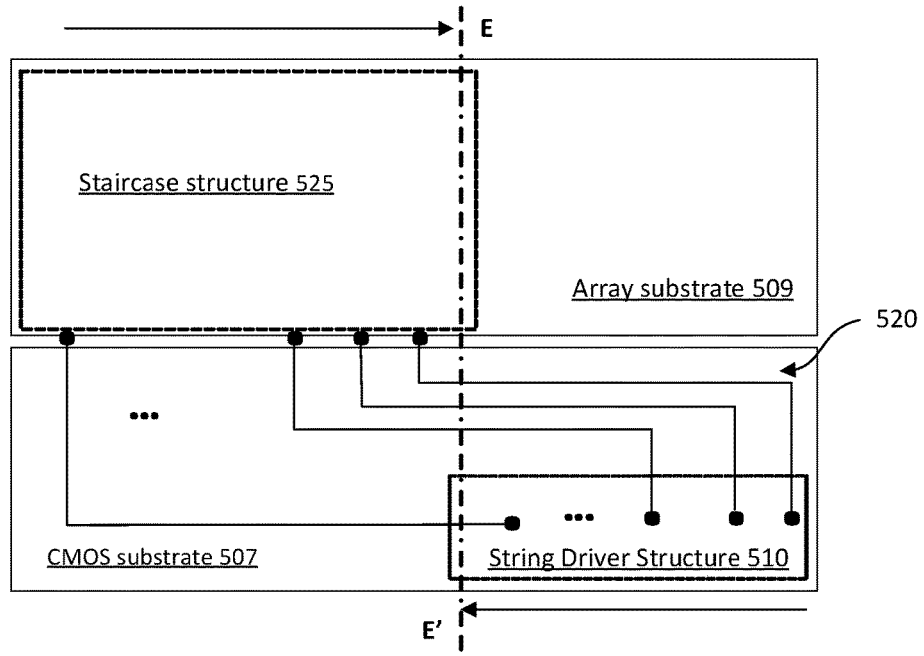
FIG. 5 illustrates a routing layout of another memory device.
Figure 6:
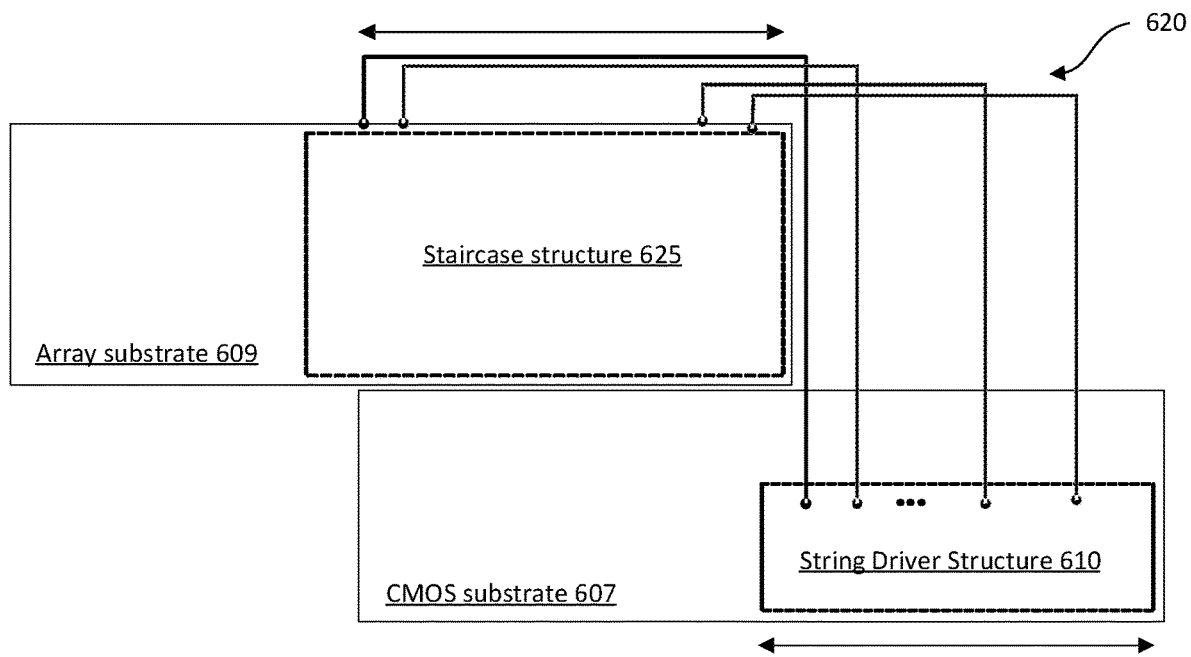
FIG. 6 illustrates another routing layout of another memory device.

FIGS. 5-6 illustrate other possible configurations of examples of routing layouts between string driver structure and staircase structure.

As shown in FIG. 5, a CMOS substrate 507 and an array substrate 509 are stacked one over another. A staircase structure 525 is formed in the array substrate 509 and is connected to a string driver structure 510 formed in the CMOS substrate 507 by metal layers 520. The string driver structure 510 are deployed on a side apposite to the staircase structure 525 along a lateral direction. As shown, the staircase structure 525 is arrange on a side of the E-E' line, while the string driver structure 510 is formed on an opposite side of the E-E' line. As the number of word line tiers in the staircase structure 525 increases, the number and layout area of the metal layers 520 have to increase. The routing layout in FIG. 5 does not provide efficient spacing, and metal usage has to be increased. For example, as the number of word line tiers further increases, additional metal layers have to be added to accommodate the increased number of string drivers for controlling the increased number of word lines in the staircase structure. In this case, the added string drivers may be arranged along the lateral direction further away from the staircase structure.

FIG. 6 illustrates a CMOS under array (CUA) architecture of a 3D memory device. A staircase structure 625 may be formed on an array substrate 609. A CMOS substrate 607 is arranged under the array substrate 609 that has memory array layers and/or staircase structure 625 formed thereon. Metal layers 620 for routing signals between a string driver structure 610 and word lines of the staircase structure 625 of the memory array may be arranged to enable routing of one or more metal lines from contacts/traces that are above a memory array to one or more contacts below a memory array, such as contacts of string driver circuitry of the CMOS substrate 607 shown in FIG. 6. In this case, string drivers of the string driver structure 610 are connected through long via contacts toward word lines of the staircase structure 625. As the gate stack or the number of word lines increases, the number of metal routings increases, which takes up more space of the device and requires more metal usage.

Various embodiments also provide method for forming the memory device. For example, the peripheral device such as the string driver structure and the array device may be separately fabricated on different substrates so that certain high-temperature processes for fabricating the array device will not adversely affect the fabrication of the string driver structure (e.g., avoid excess diffusion of the dopants, control the doping concentration and/or thickness of ion implantation, etc.).

Figure 7A:
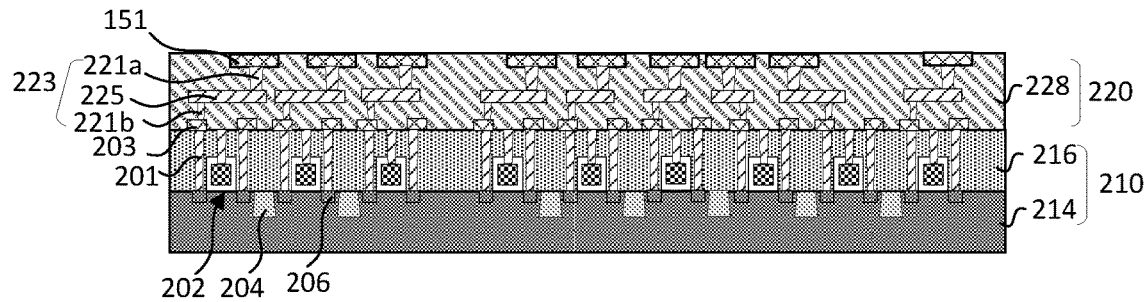
FIGS. 7A-7C illustrate schematic views of semiconductor structures at certain stages during a fabrication process of an exemplary memory device consistent with various disclosed embodiments in the present disclosure.
Figure 7B:
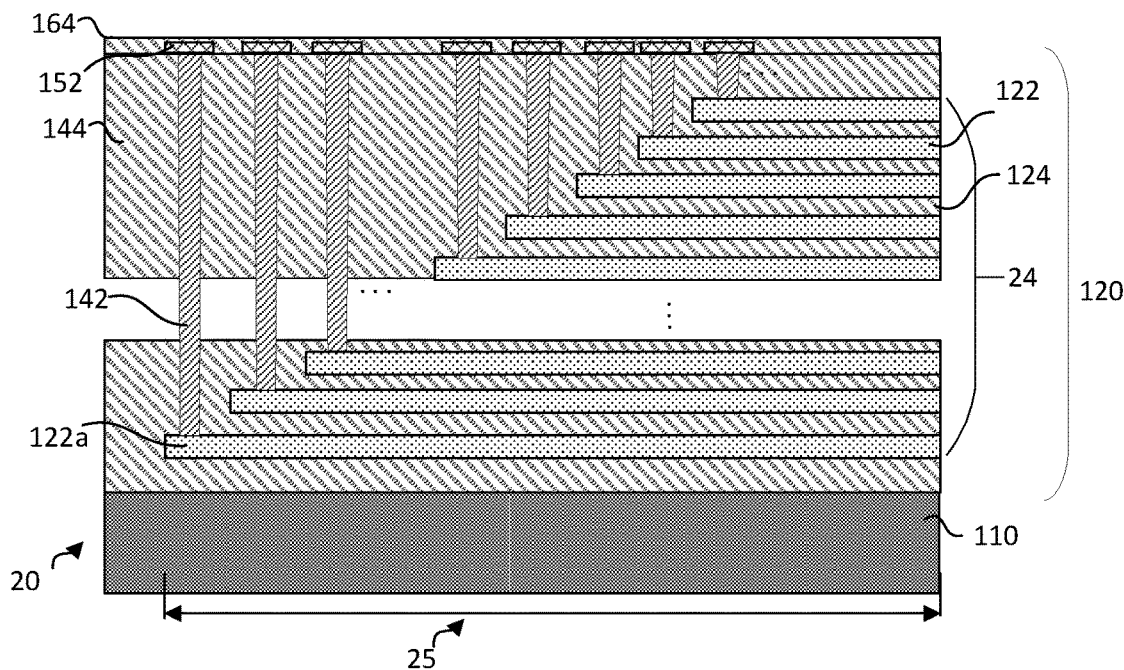
Figure 7C:
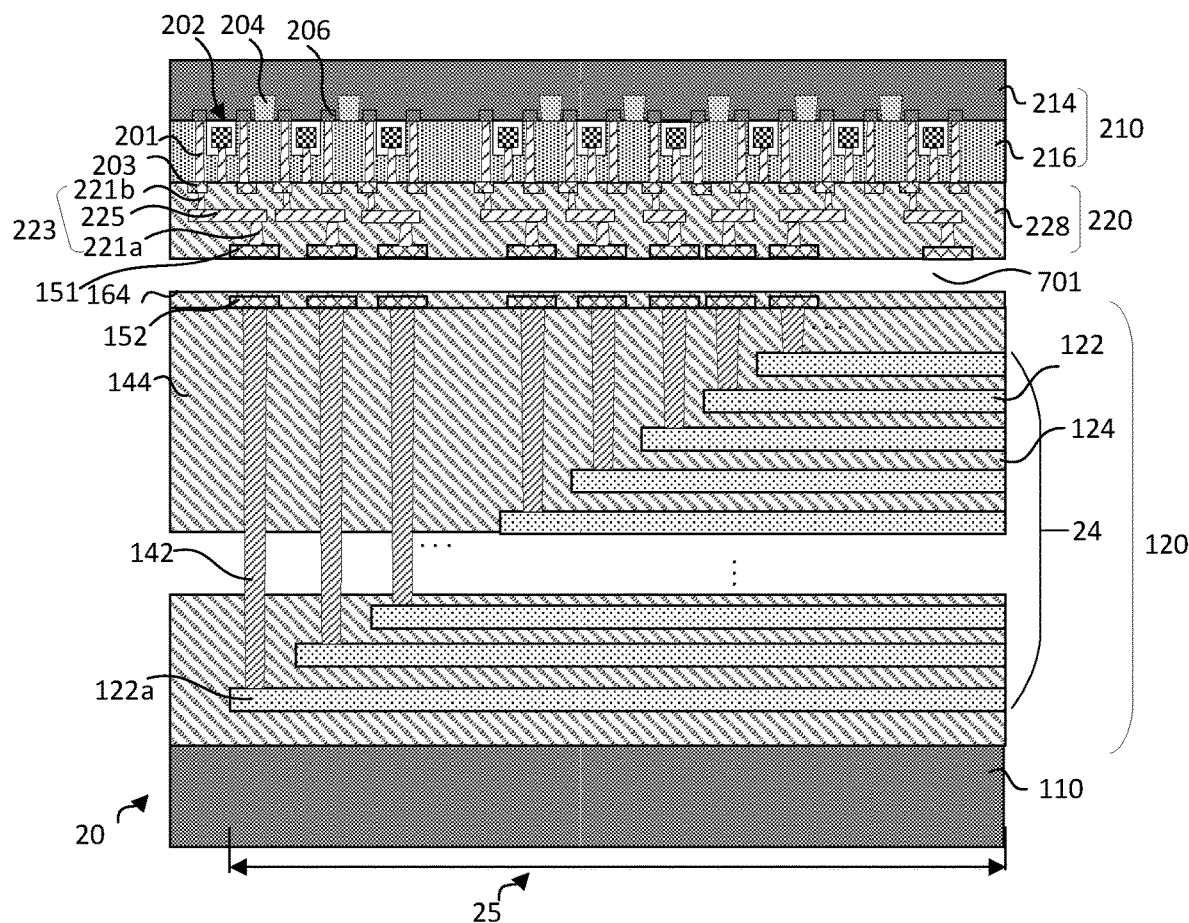

An exemplary method for forming a memory device includes: forming a string driver structure and a metal routing structure on a first substrate (e.g., first silicon substrate), forming an array device on a second substrate (e.g., second silicon substrate), and bonding the string driver structure and the array device together. FIG. 7A to FIG. 7C illustrate an exemplary fabrication process for forming a memory device according to various embodiments of the present disclosure.

As illustrated in FIG. 7A, a plurality of transistors 202 is formed on a first silicon substrate 214. The transistors 202 may be formed by a plurality of processing steps including, but not limited to, photolithography, dry/wet etch, thin film deposition, thermal growth, implantation, or any combination thereof. In some embodiments, doped regions 206 are formed in first silicon substrate 214. An isolation region 204 is also formed in first silicon substrate 214. A first dielectric layer 216 is formed on the first silicon substrate 214. The first dielectric layer 216 includes a contact plugs 201 to make electrical connections with the transistors 202.

A second dielectric layer 228 is formed on first dielectric layer 216. In some embodiments, the second dielectric layer 228 may be a combination of multiple layers and may be formed in separate steps. For example, the second dielectric layer 228 may include lateral metal layer 225 and vertical metal layers 221 and may further include a contact pad 151, which may be formed in a separate dielectric layer.

The metal layers 221/225 may include conductor materials deposited by one or more thin film deposition processes including, chemical vapor deposition (CVD), physical vapor deposition (PVD), atomic layer deposition (ALD), electroplating, electroless plating, or any combination thereof. Fabrication processes for forming the metal layers may also include photolithography, polishing, wet/dry etch, or any combination thereof. The dielectric layers 216, 228 may be formed by thin film deposition processes including, but not limited to, CVD, PVD, ALD, or any combination thereof.

FIG. 7B illustrates an array device 120 formed on a second substrate 110. The second substrate 110 may be a silicon substrate. An array device 120 may be formed on second silicon substrate 110.

An alternating conductor/dielectric stack 24 may be formed including layer pairs of a conductor layer 122 and a dielectric layer 124. In one embodiment, the alternating conductor/dielectric stack 24 may be formed by first forming alternating dielectric stack 408 including two different dielectric layers, followed by replacing one of the two dielectric layers with the conductor layer 122, thereby forming a plurality of conductor/dielectric layer pairs in an alternating conductor/dielectric stack 24. The replacement of the dielectric layers with conductor layers 122 may be performed by wet etching the dielectric layers selective to another dielectric layers and filling the structure with conductor layers 122. The conductor layers 122 may be filled by CVD, ALD, any other suitable process, or any combination thereof. The conductor layers 122 may include conductor materials including, but not limited to, W, Co, Cu, Al, polysilicon, silicides, or any combination thereof. The alternating dielectric stack may be formed by one or more thin film deposition processes including, but not limited to, CVD, PVD, ALD, or any combination thereof. In some embodiments, the alternating dielectric stack may be replaced by a plurality of conductor/dielectric layer pairs, i.e., an alternating stack of a conductor layer (e.g., polysilicon) and a dielectric layer (e.g., silicon oxide).

In some embodiments, word line contact plugs 142 are formed over second silicon substrate 110. Each word line contact plug 142 may extend vertically through a dielectric layer 144. In some embodiments, an end of word line contact plug 142 lands on a word line tier 122 (e.g., a part of conductor layer 122), such that each word line contact plug 142 is electrically connected to a corresponding word line tier 122. Each word line contact plug 142 may be electrically connected to a corresponding word line tier 122 to individually address the corresponding word line of memory cell strings.

In some embodiments, the word line contact plugs 142 are formed by forming a vertical opening through the dielectric layer 144 using dry/wet etch process, followed by filling the opening with conductor materials and other materials (e.g., a barrier layer, an adhesion layer, and/or a seed layer) for conductor filling, adhesion, and/or other purposes. The word line contact plugs 142 may include conductor materials including, but not limited to, W, Co, Cu, Al, doped silicon, silicides, or any combination thereof. The openings of word line contact plugs 142 may be filled with conductor materials and other materials by ALD, CVD, PVD, electroplating, any other suitable processes, or any combination thereof.

In some embodiments, contact pads 152 and a dielectric layer 164 are formed. The contact pads 152 may include conductor materials including, but not limited to, W, Co, Cu, Al, doped silicon, silicides, or any combination thereof. The dielectric layer 164 may include dielectric materials including, but not limited to, silicon oxide, silicon nitride, silicon oxynitride, or any combination thereof.

In FIG. 7C, the string driver structure 210 may be bonded to the staircase structure 120 by flipping the string driver structure 210 upside down, aligning the metal routing structure 220 facing down towards the staircase structure 120 with the contact pads 152 facing up (in a face-to-face manner), placing the string driver structure 210 above the staircase structure 120 so that the metal routing structure 220 is above and in contact with the contact pads 152 of the staircase structure 120, performing a bonding treatment, and bonding the metal routing structure 220 with the staircase structure 120. In some embodiments, the bonding treatment includes a plasma process, a wet process, and/or a thermal process. In some embodiments, the contact pads 151, 152 include Cu.

The bonding process may include a hybrid bonding, e.g., metal/dielectric hybrid bonding, which may be a direct bonding between surfaces without using intermediate layers, such as solder or adhesives), which may provide obtain metal-metal bonding and dielectric-ix) dielectric bonding simultaneously.

In this manner, an exemplary memory device may be formed by, for example, forming an alternating conductor/dielectric stack 24 over a substrate 110. The alternating conductor/dielectric stack 24 may include a plurality of word line tiers of a staircase structure 25 over the substrate 110. A semiconductor device, such as a CMOS device, may be formed to include a string driver structure 210 and a metal routing structure 220. The metal routing structure 220 may contact on the string driver structure 210, and the string driver structure 210 may include a plurality of transistors 202. The metal routing structure 220 of the semiconductor device may be aligned and bonded with the staircase structure 25 over the substrate 110.

The string driver structure 210 and the metal routing structure 220 may be vertically aligned with the staircase structure 25 based on a lateral central region a of the staircase structure 25, as shown in FIG. 2. The plurality of transistors 202 of the string driver structure 210 may individually address the plurality of word line tiers of the staircase structure 25.

Optionally, the lateral central region a of the staircase structure 25 may have a lateral length that is about 50% or less of a total lateral length of the staircase structure 25. In one embodiment, the total lateral length of the staircase structure 25 may be the greatest stair length of a word line tier 122a among the plurality of word line tiers 122.

Optionally, the string driver structure 210 and the metal routing structure 220, that are vertically aligned with the staircase structure 25, may have lateral central lines that fall within the lateral central region a of the staircase structure 25. The string driver structure 210 and the metal routing structure 220, that are vertically aligned with the staircase structure 25, may have lateral central regions each overlapping with the lateral central region a of the staircase structure 25.

Optionally, the staircase structure 25 may have a lateral central line C-C' determined based on a greatest stair length of a word line tier 122a among the plurality of word line tiers 122 and the lateral central region a may cover or determined by and around the lateral central line C-C'.

Optionally, the string driver structure 201, the metal routing structure 220, and the staircase structure 25 may be vertically aligned and centered based on a lateral central line C-C' of the staircase structure 25.

In some embodiments, the metal routing structure 220 may include a plurality of metal layer structures 223, arranged between the staircase structure 25 and the string driver structure 210. One metal layer structure 223 may connect one transistor of the plurality of transistors 202 with a word line tier of the plurality of word line tiers 122. Each metal layer structure 223 may include at least one laterally oriented metal layer 225 extending along a lateral direction in a dielectric layer 228, and a plurality of vertically oriented metal layers 221 extending along the vertical direction in the dielectric layer 228.

Optionally, the plurality of vertically oriented metal layers 221 may includes a first vertically oriented metal layer 221a electrically connected to a corresponding word line tier 122 and a second vertically oriented metal layers 221b electrically connected to a corresponding transistor 202. The first and second vertically oriented metal layers 221a-b may be connected by the at least one laterally oriented metal layer 225. The at least one laterally oriented metal layer 225 in each metal layer structure 223 may have a different lateral length.

A word line contact plug 142 may contact a corresponding word line tier 122 on a side extending away from the substrate 110, to allow a direct connection between the staircase structure 25 and the metal routing structure 220 and thus the string driver structure 210. A plurality of memory cell strings 68 may be formed, extending in the vertical direction in a cell array region 10 over the substrate 110, as shown in FIG. 1. As disclosed, the memory device is formed with reduced die/device space, scaled string driver area, and improved overall die/device efficiency.

The above detailed descriptions only illustrate certain exemplary embodiments of the present disclosure, and are not intended to limit the scope of the present disclosure. Those skilled in the art may understand the specification as whole and technical features in the various embodiments may be combined into other embodiments understandable to those persons of ordinary skill in the art. Any equivalent or modification thereof, without departing from the spirit and principle of the present invention, falls within the true scope of the present invention.

What is claimed is:

1. A memory device, comprising:
a substrate;
a staircase structure, on the substrate, wherein the staircase structure includes a plurality of word line tiers;
a string driver structure, the staircase structure being between the string driver structure and the substrate, and the string driver structure including a plurality of transistors to individually address the plurality of word line tiers; and
a metal routing structure, between the string driver structure and the staircase structure along a vertical direction with respect to a lateral surface of the substrate, wherein:
the metal routing structure includes a plurality of metal layer structures, and
each of a projection area of an entire metal routing structure including the plurality of metal layer structures and a projection area of the string driver structure on the substrate is greater than and covers a projection area of the staircase structure on the substrate to allow each of the string driver structure and the metal routing structure to be vertically aligned with the staircase structure based on a lateral central line of a lateral central region of the staircase structure.

2. The device according to claim 1, wherein:
the lateral central region of the staircase structure has a lateral length that is about 50% or less of a total lateral length of the staircase structure.

3. The device according to claim 1, wherein:
the string driver structure and the metal routing structure, that are vertically aligned with the staircase structure, each have a lateral central line that falls within the lateral central region of the staircase structure.

4. The device according to claim 1, wherein:
the string driver structure and the metal routing structure, that are vertically aligned with the staircase structure, each have a lateral central region overlapping with the lateral central region of the staircase structure.

5. The device according to claim 1, wherein:
the staircase structure has a lateral central line determined based on a greatest stair length of a word line tier among the plurality of word line tiers, and the lateral central line falls within the lateral central region.

6. The device according to claim 1, wherein:
one metal layer structure connects one transistor of the plurality of transistors with a word line tier of the plurality of word line tiers for signal routing.

7. The device according to claim 1, wherein each metal layer structure includes:
at least one laterally oriented metal layer extending along a lateral direction within a dielectric layer, and
a plurality of vertically oriented metal layers extending along the vertical direction in the dielectric layer.

8. The device according to claim 7, wherein:
the plurality of vertically oriented metal layers includes a first vertically oriented metal layer electrically connected to a corresponding word line tier and a second vertically oriented metal layers electrically connected to a corresponding transistor.

9. The device according to claim 8, wherein:
the first and second vertically oriented metal layers are connected by the at least one laterally oriented metal layer.

10. The device according to claim 7, wherein:
the at least one laterally oriented metal layer in each metal layer structure has a different lateral length.

11. The device according to claim 1, further comprising:
a word line contact plug contacting a corresponding word line tier on a side extending away from the substrate, to allow a direct connection between the staircase structure and the string driver structure.

12. The device according to claim 1, further comprising:
a plurality of memory cell strings, extending in the vertical direction and formed in a cell array region over the substrate, wherein
along the vertical direction, the string driver structure is non-overlapped with the cell array region.

13. The device according to claim 1, further comprising:
the string driver structure and/or the metal routing structure are vertically aligned with the staircase structure to substantially symmetrically configured along the lateral central line of the staircase structure.

14. A method for forming a memory device, comprising:
forming an alternating conductor/dielectric stack over a substrate, wherein the alternating conductor/dielectric stack includes a plurality of word line tiers of a staircase structure over the substrate;
forming a semiconductor device including a string driver structure and a metal routing structure contacting on the string driver structure, the string driver structure including a plurality of transistors and the metal routing structure including a plurality of metal layer structures; and
aligning and bonding the metal routing structure of the semiconductor device with the staircase structure over the substrate, wherein:
each of a projection area of an entire metal routing structure including the plurality of metal layer structures and a projection area of the string driver structure on the substrate is greater than and covers a projection area of the staircase structure on the substrate to allow each of the string driver structure and the metal routing structure to be vertically aligned with the staircase structure based on a lateral central line of a lateral central region of the staircase structure, and
the plurality of transistors of the string driver structure individually addresses the plurality of word line tiers of the staircase structure.

15. The method according to claim 14, wherein:
the lateral central region of the staircase structure has a lateral length that is about 50% or less of a total lateral length of the staircase structure.

16. The method according to claim 14, wherein:
the string driver structure and the metal routing structure, that are vertically aligned with the staircase structure, have lateral central lines that fall within the lateral central region of the staircase structure.

17. The method according to claim 14, wherein:
the string driver structure and the metal routing structure, that are vertically aligned with the staircase structure, have lateral central regions each overlapping with the lateral central region of the staircase structure.

18. The method according to claim 14, wherein:
one metal layer structure connects one transistor of the plurality of transistors with a word line tier of the plurality of word line tiers.

19. The method according to claim 14, wherein each metal layer structure includes:
at least one laterally oriented metal layer extending along a lateral direction in a dielectric layer,
a plurality of vertically oriented metal layers extending along the vertical direction in the dielectric layer,
the plurality of vertically oriented metal layers includes a first vertically oriented metal layer electrically connected to a corresponding word line tier and a second vertically oriented metal layers electrically connected to a corresponding transistor of the plurality of transistors, and
the first and second vertically oriented metal layers are connected by the at least one laterally oriented metal layer.

20. The method according to claim 14, further comprising:
forming a word line contact plug, contacting a corresponding word line tier on a side extending away from the substrate, to allow a direct connection between the staircase structure and the string driver structure.

* * * * *